United States Patent [19]
Peng

[11] Patent Number: 6,103,596
[45] Date of Patent: *Aug. 15, 2000

[54] PROCESS FOR ETCHING A SILICON NITRIDE HARDMASK MASK WITH ZERO ETCH BIAS

[75] Inventor: Chiang-Jen Peng, Hsin Chu, Taiwan

[73] Assignee: Taiwan Semiconductor Manufacturing Company, Hsin-Chu, Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 09/025,809

[22] Filed: Feb. 19, 1998

[51] Int. Cl.⁷ .................................................. H01L 21/762
[52] U.S. Cl. ......................... 438/439; 438/696; 438/780; 438/950; 438/725
[58] Field of Search .................................. 437/FOR 389, 437/424, 439, FOR 427, 725, 780, 695, 696, 700; 438/671, 717, 950

[56] References Cited

U.S. PATENT DOCUMENTS

| | | |
|---|---|---|
| 4,613,400 | 9/1986 | Tam et al. . |
| 4,707,218 | 11/1987 | Giammarco et al. . |
| 4,803,181 | 2/1989 | Buchmann et al. . |
| 4,855,017 | 8/1989 | Douglas . |
| 5,342,481 | 8/1994 | Kadomura . |

FOREIGN PATENT DOCUMENTS

| | | |
|---|---|---|
| 2-69937 | 3/1990 | Japan . |
| 5-259269 | 10/1993 | Japan . |

*Primary Examiner*—George Fourson
*Attorney, Agent, or Firm*—George O. Saile; Stephen B. Ackerman

[57] ABSTRACT

A method for controlling the mask bias of a photoresist mask is described whereby a polymer coating is formed over the patterned photoresist mask immediately prior to etching the mask's pattern into a subjacent layer. The polymer coating is formed by treatment of the photoresist mask with a plasma, struck in within a reactive ion etching tool, in a gas mixture containing chlorine and helium. The etch durability and the thickness of the polymer coating determines the dimensional bias of the mask with respect to the pattern formed in the subjacent layer. By varying the polymer formation parameters a controllable etch bias between –0.01 and +0.03 microns can be achieved. This capability is particularly useful for patterning in integrated circuits where critical dimensions approach the resolution limits of the photolithography. The method is applied to the patterning of a silicon nitride hardmask employed in the formation of field oxide isolation (LOCOS) where a zero bias condition is achieved. The polymer coating can be formed in the same tool that is used to etch the hardmask, making the process simple and cost effective.

12 Claims, 5 Drawing Sheets

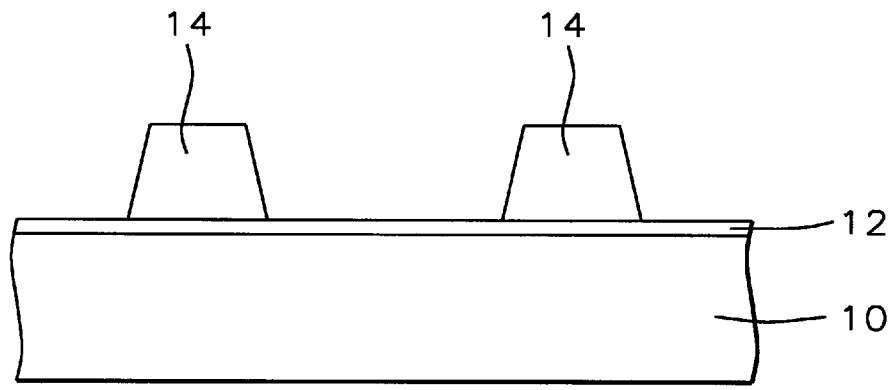
FIG. 1 – Prior Art
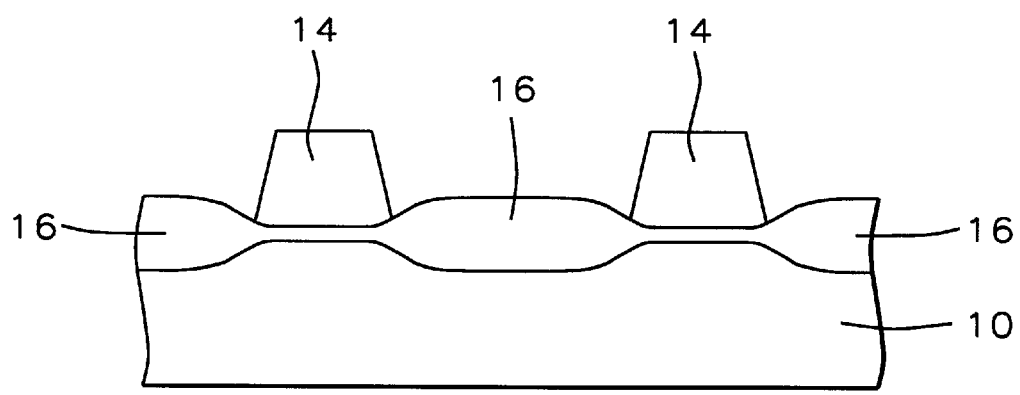
FIG. 2 – Prior Art

PROCESS FOR ETCHING A SILICON NITRIDE HARDMASK MASK WITH ZERO ETCH BIAS

BACKGROUND OF THE INVENTION (1) Field of the Invention

The invention relates to processes for the manufacture of semiconductor devices and more particularly to processes for forming field isolation.

(2) Description of prior art and background to the invention.

The formation of integrated circuit devices on silicon substrates requires that a means be provided to electrically isolate the various circuit components from each other. In many cases pin junctions themselves can be used to form at least part of the necessary isolation. Most isolation requirements, which cannot be resolved by circuit design, relate to the lateral isolation of devices. To some extent, junction isolation can be used here also. However, as device technology leads to smaller and smaller geometries as well as shallower structures, junction isolation technology becomes very limited.

The successful use of silicon for integrated circuits for the last thirty years can, in part, be attributed to the marvelous insulating properties of it's oxide. No other commonly known semiconductor material has this unique feature. Thus silicon oxide has become well established as the isolation material for integrated circuit chips. Earliest usage of this material involved growing it on the substrate in selected regions which are defined by an oxidation masking material. To this end, silicon nitride has come into widespread use. Referring to FIG. 1, a pad silicon oxide film 12 several hundred Angstroms thick, is grown on the surface of a silicon wafer 10. Next a silicon nitride layer 14 is deposited to a thickness of several thousand Angstroms using a chemical-vapor-deposition (CVD) process. be silicon nitride layer 14 is patterned and used as a hard mask for the isolation oxidation. The pad oxide 12 serves as a buffer layer, preventing the highly stressed silicon nitride from causing dislocations in the silicon.

Using standard photolithographic techniques followed by plasma etching or reactive ion etching (RIE), a pattern is defined in the silicon nitride, exposing regions which are to become the isolation regions. Referring next to FIG. 2, the wafer 10 is subjected to an oxidizing ambient at elevated temperatures, during which the exposed areas are converted to silicon oxide 16. The oxidation The oxidation proceeds at the oxide-silicon interface. Thereby pockets of silicon oxide 16 several thousand Angstroms deep can be formed in the patterned areas. These pockets 16 provide the necessary electrical isolation for the subsequently formed semiconductor devices. The process just described has become known by several names, one of which is LOCOS an acronym for LOCal Oxidation of silicon. LOCOS has been practiced for over twenty-five years and has successfully been developed to keep the pace with shrinking device dimensions.

One of the problems which becomes serious as device geometries shrink to dimensional levels below half micron, is the ability of the silicon nitride mask to faithfully replicate the photoresist pattern after it has been etched. This is true of any hardmask. In a conventional etching process the photoresist mask suffers some deterioration by isotropic etching during the patterning etch, particularly during plasma etching. As the mask deteriorates, the walls of the subjacent silicon nitride openings develop a taper so that the dimensions at the base of the silicon nitride pattern are not the same as those of the photomask. This is illustrated by FIGS. 3A and 3B. In FIG. 3A there is shown a cross section of a wafer 10 a pad oxide layer 12 and a silicon nitride layer 14. A photoresist layer 16 is patterned to provide the features 20 and 22 which protect regions of the wafer wherein active device areas are to be formed. The taper angle $\alpha_1$ in a typical example is about 85°. The dimension "$a_1$" determines the width of the active area and the dimension "$b_1$" determines the width of the oxide isolation.

FIG. 3B shows the same cross section after the silicon nitride hard mask has been patterned by plasma etching. The dashed lines represent the original profile shown in FIG. 3A. Because of deterioration of the photomask 20, the dimension "$a_2$" at the base of the silicon nitride hard mask feature becomes somewhat smaller than "$a_1$". Similarly the dimension "$b_2$" for the isolation region width becomes somewhat larger than the corresponding photomask dimension "$b_1$". The angle a also exhibits a small decrease after the silicon nitride is etched.

When these dimensions are sufficiently large compared to the resolution of the photolithographic equipment, the standard practice is to design the photomask with a bias. That is to say the dimensions of the photomask are adjusted so that the proper design dimension is realized in the silicon nitride hard mask. Additional bias is also incorporated to compensate for the small amount of oxide which grows under the edge of the silicon nitride, commonly referred to as "birds beak", during the subsequent isolation oxidation.

When the dimensions of the photomask approach the limits of resolution of the photolithography, however, the inclusion of a mask bias is best avoided. It thus becomes desirable to reduce the amount of deterioration of the photomask during the patterning etch, in order to minimize the required photomask bias. The current invention provides a method for improving the photomask so that the silicon nitride hard mask properly replicates the dimensions of the photomask and the need for a design bias is eliminated. This accomplished by eliminating the isotropic lateral etching of the photomask.

Tam et. al, U.S. Pat. No. 4,613,400 cites a method for increasing the etch resistance of a photoresist mask used for the etching of silicon. By employing a plasma by containing HCl and $BCl_3$ in the presence of silicon or silicon containing materials, a spongy coat is formed over the photoresist. This sponge-like coat is then oxidized by subjecting it to an atmosphere containing HCl and oxygen to form a an inorganic cap which is resistant to a subsequent silicon etchant.

Giammarco et. al. U.S. Pat. No. 4,707,218 reduce pattern dimensions of a photoresist mask by depositing a conformal layer of a material over the patterned mask and then performing an anisotropic etch forming sidewalls within the mask pattern. This procedure was proposed to form openings smaller than the capability of the lithography. This method, which has the disadvantage of additional processing steps and deposited films, is not a viable alternative to photomask biasing, particularly in sub-half micron technology.

Kadomura, U.S. Pat. No. 5,342,481 deposit material in a microwave plasma along the edges of a negatively tapered resist mask in order to remove the taper and provide a substantially vertical sidewall. This mask is then used to etch layers which require radical mode etching such as polysilicon or aluminum. Removal of the photomask taper permits these materials to be etch without dimensional changes. $SiCl_4$ and $N_2$ are used to form the material for filling in the taper. In another example $S_2F_2$ and $H_2S$ were used.

SUMMARY OF THE INVENTION

It is an object of this invention to provide a method for forming a silicon nitride hardmask from a photoresist mask with a zero mask bias.

It is another object of this invention to provide a method for application of a polymer coating to a photomask which permits control of lateral etching of said photomask during etching of a pattern in a subjacent layer in a manner that the dimensional bias of the pattern in said subjacent layer can be controlled.

It is yet another object of this invention to provide a method for reducing the number of process steps and thereby reducing the cycle time and running cost for forming a silicon nitride hardmask for LOCOS.

These objects and others which will become apparent are achieved by forming a polymer over the surface of a patterned photoresist mask prior to the etching of said pattern in a subjacent layer. The polymer formation can be performed in a calibrated manner so that a desired dimensional bias in the subjacent layer can be accomplished over a wide range encompassing both positive and negative values. By practicing the method of this invention the dimensional bias of a silicon nitride hardmask can be controlled to within ±0.005 microns.

BRIEF DESCRIPTION OF THE DRAWINGS

FIG. 1 is a cross sectional view of a wafer with a conventional LOCOS oxidation mask before the formation of field oxide isolation.

FIG. 2 is a cross sectional view of a wafer with a conventional LOCOS oxidation mask after the formation of field oxide isolation.

DESCRIPTION OF THE PREFERRED EMBODIMENT

Figure 3A:
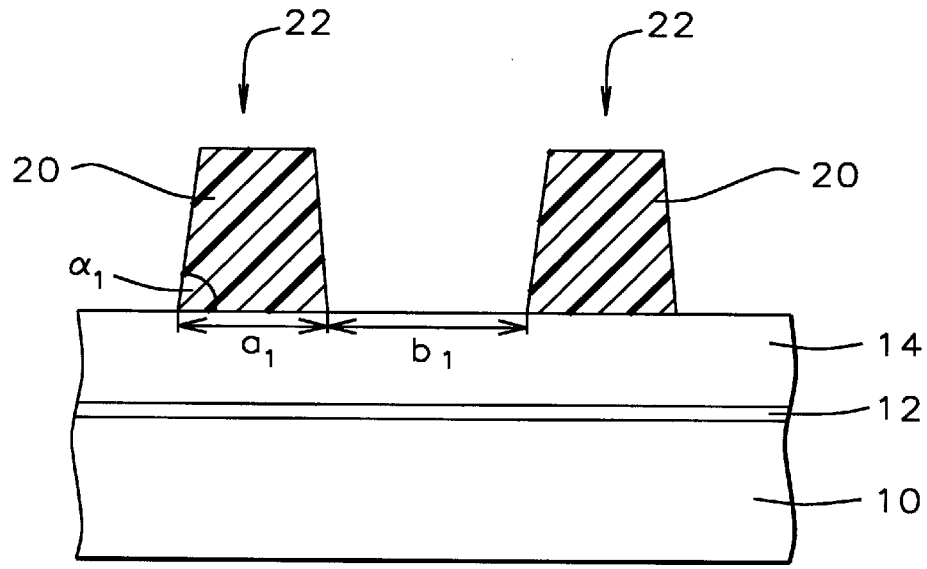
FIG. 3A is a cross sectional view of a wafer with photoresist pattern formed over a silicon nitride layer prior to the patterning of the hard mask.
Figure 3B:
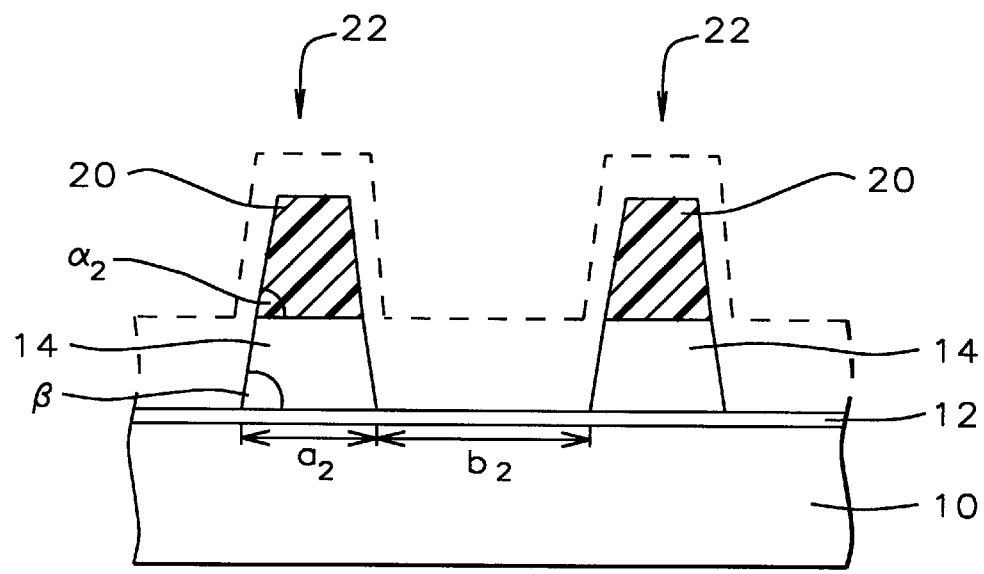
FIG. 3B is a sectional view of a wafer after patterning of a silicon nitride hard mask, showing the residual photoresist mask still in place.
Figure 4A:
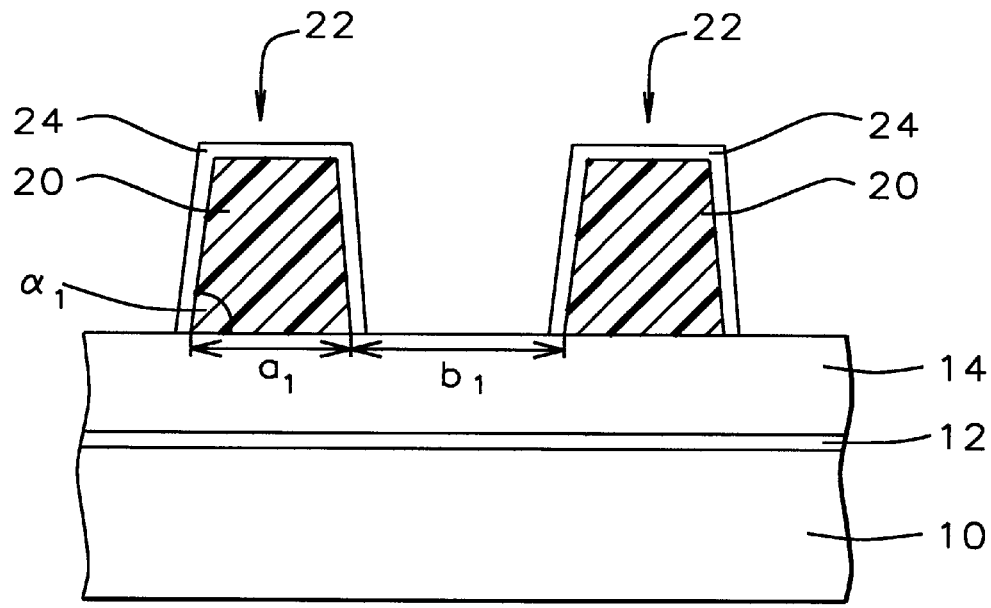
FIG. 4A is a cross sectional view of a wafer with photoresist pattern formed over a silicon nitride layer prepared according to the method of the current invention prior to the patterning of the hard mask.

Referring now to FIG. 4A, a monocrystalline silicon wafer 10 is provided. A multi-layered oxidation mask is formed by first growing a layer of silicon oxide(pad oxide) 12 to a thickness of about 20 nm. by subjecting the wafer to a clean dry oxidizing ambient in a furnace at about 950° C. A silicon nitride layer 14 between about 150 and 200 nm. thick is then deposited, preferably by low pressure chemical vapor deposition (LPCVD). Alternately the layer 14 made be formed of silicon oxide.

Photoresist 20 is applied over the mask stack, and patterned by well known photolithographic techniques to define the areas 22 where device active regions are to be formed and therefore are to be shielded from field oxide formation. The dimension $a_1$ is the design dimension for the silicon active area corrected only for birds beak. This correction typically is 0.06 microns or thereabout. In an example of the current embodiment the active region is 0.37 microns wide. Thus the dimension $a_1$ is 0.37+0.06=0.43 microns.

The wafer 10 is placed into an plasma etching tool and evacuated. A gas mixture containing $Cl_2$ at a flow rate of between about 200 and 400 SCCM and He at a flow rate of between about 250 and 550 SCCM is admitted into the chamber and the pressure is maintained at between about 325 and 525 mTorr. The gap between the wafer 10 and the counter-electrode in the etcher is set to between about 0.7 and 0.9 cm. A pressure of 6 Torr or thereabout of helium is directed at the backside of the wafer which improves the wafer temperature uniformity. rf power is applied for a period of between 10 and 30 seconds during which time a polymer coating 24 is formed over the photoresist pattern. The polymer layer 24 increases the pattern dimension by about 2 nm.

The polymer coating 24 not only makes the photomask more durable towards the etchant gases which are subsequently used to etch the $Si_3N_4$, but also provides an initial increase in the mask dimension which compensates for mask sidewall erosion during the $Si_3N_4$, etch. Effectively this corresponds to a positive bias applied to the photomask. Thus by controlling the thickness and properties of the polymer coating 24, it is possible to vary the resultant bias of the $Si_3N_4$, hard mask dimensions with respect to the photomask over a range extending from negative values to positive values. In addition the polymer coating is formed on the photoresist in the same tool wherein the $Si_3N_4$ is subsequently etched, thereby combining the coating and plasma etching steps into one tool operation within a single pumpdown. This also avoids exposure of the chlorine containing polymer coating to atmospheric moisture which could cause deterioration of the coating.

After the polymer coating 24 is formed, the gas mixture and conditions are adjusted to perform a $Si_3N_4$ plasma etch. For this embodiment a mixture containing $SF_6$ at a flow rate of between about 80 and 120 SCCM and HBr at a flow rate of between about 20 and 30 SCCM in a He carrier gas at 250 SCCM or thereabout may be used, although other etch chemistries may be employed as well. The $Si_3N_4$ plasma etch typically employs three stages of etching, each with an etchant gas containing a fluorine species. A bulk etch using $CHF_3$ and $SF_6$ in He is used to remove most of the $Si_3N_4$ layer. Then an $HBr/SF_6$ combination is a used to reach end point which is detected by optical emission spectroscopy. Finally $O_2$ is added to the $HBr/SF_6$ mixture in an over etch period.

Figure 4B:
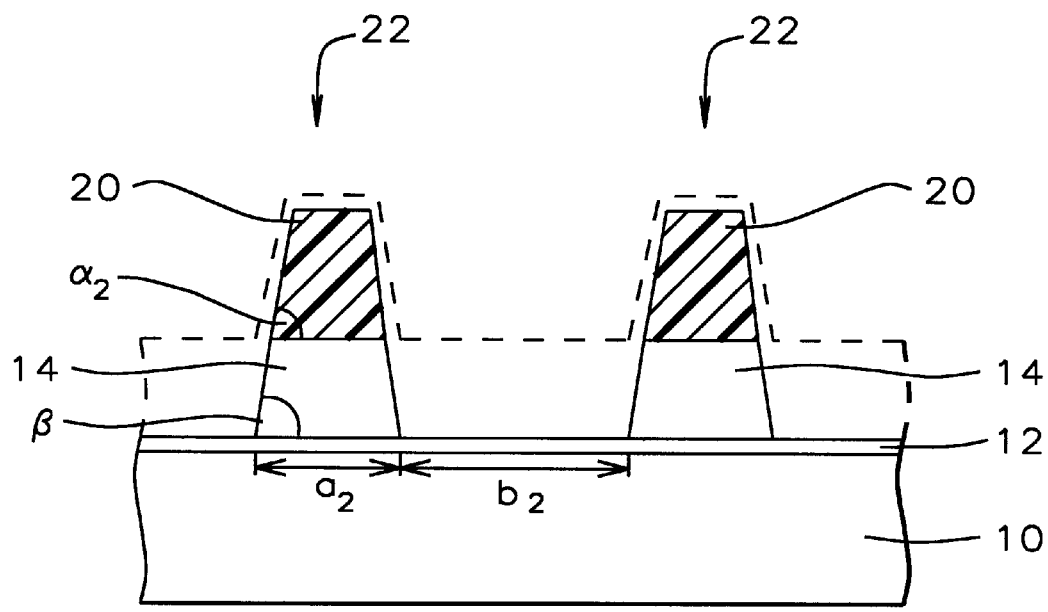
FIG. 4B is a cross sectional view of a wafer after patterning of a silicon nitride hard mask as taught by the current invention.

Referring now to FIG. 4B there is shown a cross section of the completed $Si_3N_4$ hardmask. The dashed lines represent the profile before the $Si_3N_4$ etch step. In this embodiment a zero bias of photomask was used to form the hardmask. Table I gives the values of the measured angles and dimensions of an example configuration before and after the $Si_3N_4$ etch for a conventional process and for the process of this invention wherein the polymer coating was prepared to produce zero bias.

TABLE I

| Parameter | Conventional | Polymer Coating (Zero Bias) |
|---|---|---|
| $a_1$ (μm) | 0.430 | 0.430 |
| $a_2$ (μm) | 0.400 | 0.430 |
| $b_1$ (μm) | 0.344 | 0.344 |
| $b_2$ (μm) | 0.374 | 0.344 |
| $\alpha_1$ (deg) | 85 | 85 |
| $\alpha_2$ (deg) | 84 | 85 |
| $\beta$ (deg) | 82 | 88 |

Photoresist thickness = 700 nm.
Silicon Nitride Thickness = 170 nm.

Figure 5A:
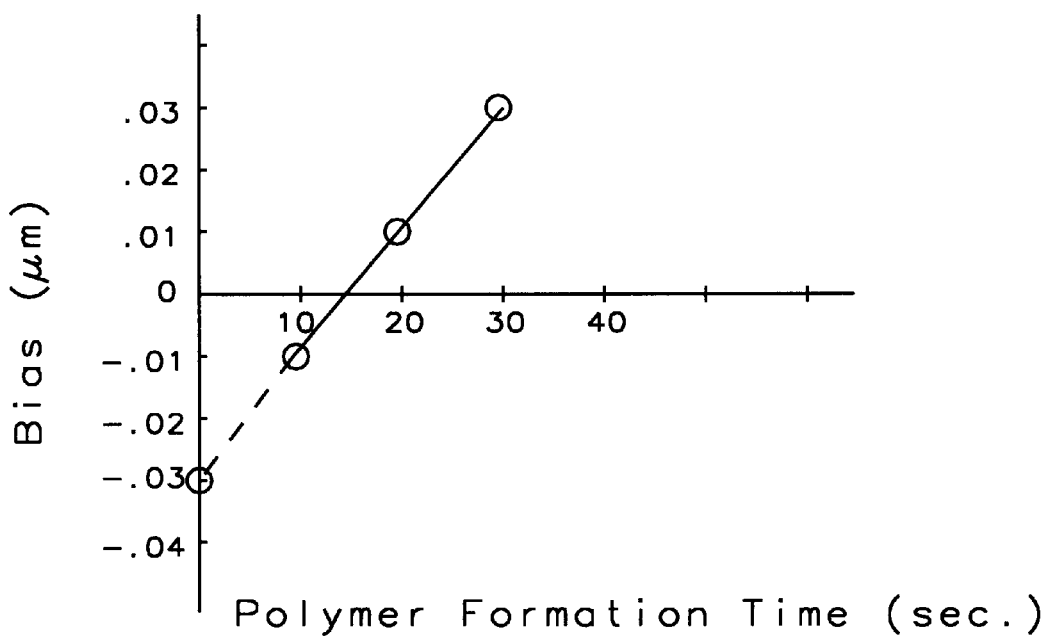
FIG. 5A is a chart showing the variation of dimensional bias with polymer formation time.
Figure 5B:
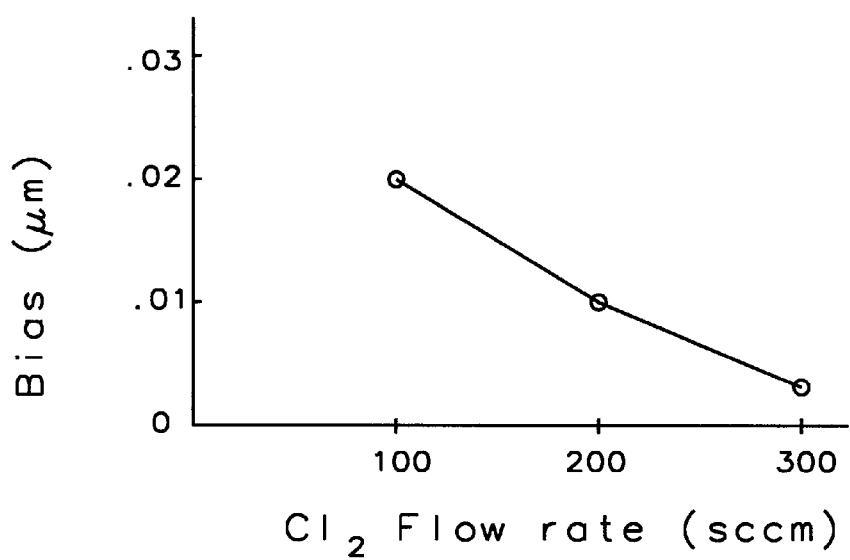
FIG. 5B is a chart showing the variation of dimensional bias with the flow rate of chlorine.
Figure 5C:
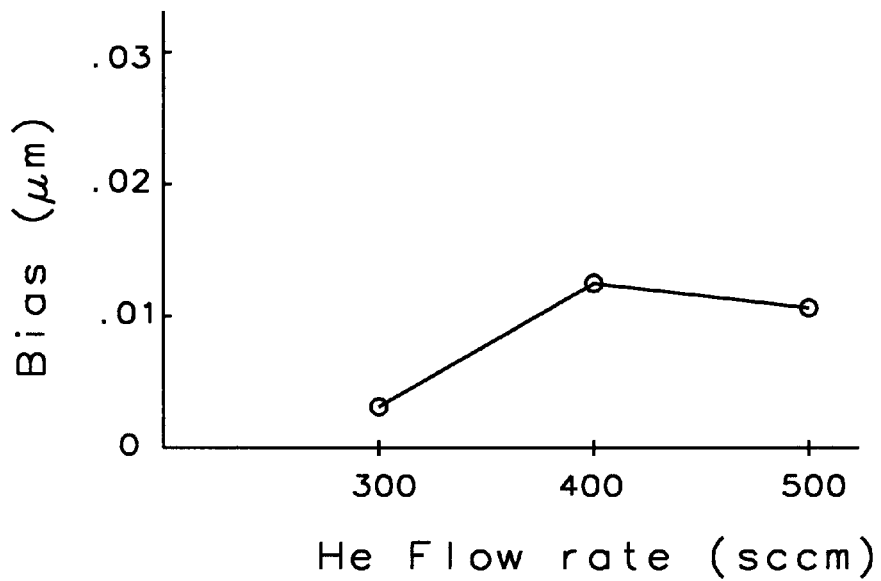
FIG. 5C is a chart showing the variation of dimensional bias with the flow rate of helium.
Figure 5D:
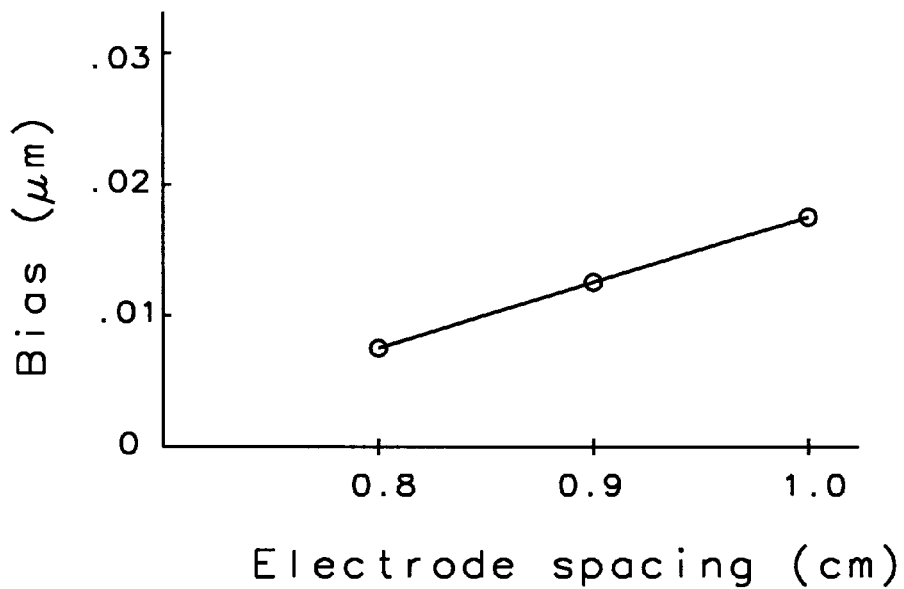
FIG. 5D is a chart showing the variation of dimensional bias with electrode spacing.

Four parameters of the polymer deposition step have a measurable influence on the properties of the polymer coating which effect the resultant critical dimension bias. They are the $Cl_2$ flow rate, the He flow rate, the time of the deposition and the electrode spacing or gap. The effect of variation of each of these parameters, when the others are held constant is illustrated in FIGS. 5A through 5D. The sign of the bias in these figures indicates whether the pattern that is masked by the photomask increases or decreases in dimension after the etch step. Referring first to FIG. 5A, as the time of polymer formation increases the polymer coating becomes thicker, thereby increasing the photomask dimensions as well as its durability. The trends of the other parameters shown in FIGS. 5B through 5D are varied but must be considered in planning conditions to achieve a desired dimensional bias. Table II is an example of a combination of parameters which yielded an essentially zero dimensional bias.

TABLE II

| Polymer formation conditions for zero bias | |
|---|---|
| Parameter | Value |
| Cl2 Flow rate (SCCM) | 300 |
| He Flow Rate (SCCM) | 300 |
| Electrode Spacing (cm) | 0.9 |
| Formation time (sec) | 20 |
| Resultant bias (μm) | −0.0005 |

Photoresist thickness = 700 nm.
Silicon Nitride Thickness = 170 nm.

By experimentally varying these parameters, the etch bias may be adjusted with good control over a range from about −0.01 microns to +0.03 microns. The target values for these parameters to achieve a zero etch bias will depend upon the method and conditions used to etch the layer. Suitable values may be experimentally determined for plasma etching as well as RIE.

While this invention has been particularly shown and described with reference to the preferred embodiments thereof, it will be understood by those skilled in the art that various changes in form and details may be made without departing from the spirit and scope of the invention.

What is claimed is:

1. A method for forming a pattern in a layer of material with controllable dimensional bias comprising the steps of:
   (a) providing a substrate having a layer and a photoresist pattern thereon;
   (b) subjecting said substrate to a first plasma containing chlorine whereby a polymer coating is formed on the surfaces of, and thereby increasing the dimensions of, said photoresist pattern, prior to etching said layer; and
   (c) after said polymer coating is formed, etching said layer in a second plasma.

2. The method of claim 1 wherein said layer is selected from the group consisting of silicon nitride and silicon oxide.

3. The method of claim 1 wherein said controllable dimensional bias is between about −0.01 and +0.03 microns or thereabout.

4. The method of claim 1 wherein said first plasma is formed in a gas mixture of chlorine at a flow rate of between about 200 and 400 SCCM and helium at a flow rate of between about 250 and 550 SCCM and at a system pressure of between about 325 and 525 mTorr.

5. The method of claim 1 wherein said polymer coating is formed and said layer is etched within the same tool and in a single pumpdown.

6. A method for forming field oxide isolation comprising the steps of:
   (a) providing a silicon wafer;
   (b) forming a pad oxide over said silicon wafer;
   (c) forming a silicon nitride layer over said pad oxide;
   (d) forming a photoresist pattern over said silicon nitride layer;
   (e) subjecting said photoresist pattern to a treatment with a first plasma containing chlorine whereby a polymer coating is formed on the surfaces of said photoresist pattern, and whereby said treatment alters the dimensional bias of said photoresist pattern prior to etching said silicon nitride layer, and increases the durability of said photoresist pattern towards etchant gases;
   (f) after said polymer coating is formed, etching said silicon nitride layer;
   (g) removing said polymer coating and said photoresist pattern; and
   (h) oxidizing said silicon wafer thereby forming said field oxide isolation.

7. The method of claim 6 wherein said treatment produces a controllable mask bias of between about −0.01 and +0.03 microns.

8. The method of claim 6 wherein said plasma is formed in a gas mixture of chlorine at a flow rate of between about 200 and 400 SCCM and helium at a flow rate of between about 250 and 550 SCCM and a system pressure of between about 325 and 525 mTorr.

9. The method of claim 7 wherein the photoresist pattern is between about 700 and 1,000 nm, thick.

10. The method of claim 6 wherein the silicon nitride layer is between about 150 and 200 nm/thick.

11. The method of claim 6 wherein said etching is taken from the group consisting of reactive ion etching and plasma etching.

12. The method of claim 11 wherein said polymer coating is formed and said silicon nitride layer is etched within the same tool and in a single pumpdown.

* * * * *